United States Patent [19]

Hegde et al.

[11] Patent Number: 5,087,605
[45] Date of Patent: Feb. 11, 1992

[54] LAYERED LATTICE-MATCHED SUPERCONDUCTING DEVICE AND METHOD OF MAKING

[75] Inventors: Manjanath S. Hegde, Bangalore, India; Arun Inam, Piscataway, N.J.; Charles T. Rogers, Jr., Oceanport, N.J.; Thirumalai Venkatesan, Bridgewater, N.J.

[73] Assignee: Bell Communications Research, Inc., Livingston, N.J.

[21] Appl. No.: 360,090

[22] Filed: Jun. 1, 1989

[51] Int. Cl.⁵ .................. H01B 12/00; H01L 39/12; H01L 27/12
[52] U.S. Cl. .......................... 505/1; 357/4; 357/5
[58] Field of Search ............ 357/4, 5; 505/1

[56] References Cited

FOREIGN PATENT DOCUMENTS 63-250880 10/1988 Japan ................ 357/4
63-269585 11/1988 Japan ................ 357/5

OTHER PUBLICATIONS

Ohshima et al. "Superconducting and Structural Properties of the New $Ba_{1-x}Ln_xCuO_{3-y}$ Compound System" *Japanese J. Appl. Phys.* vol. 26(5) 5/87 pp. L815-L817.

Rothschild et al., "Laser Patterning of Metal Oxide Superconductor Films by Reactive, Solid-State Transformation" *IEEE Electron Dev. Lett.*, vol. 9(2) 2/88 pp. 68-70.

Linker et al., "Control of Growth Direction of Epitaxial YBaCuO Thin Films on $SrTiO_3$ Substrates" *Solid State Comm.* vol. 69(3) pp. 249-253 (1989).

*Primary Examiner*—Andrew J. James
*Assistant Examiner*—Daniel N. Russell
*Attorney, Agent, or Firm*—James W. Falk; Leonard Charles Suchyta; Charles S. Guenzer

[57] ABSTRACT

A superconducting device and method of making in which a superconducting YBaCuO layer is laser deposited on a $SrTiO_3$ or similar substrate such that the c-axis of the YBaCuO layer is vertically aligned with that of the substrate. A non-superconducting layer of PrBaCuO or MgO is laser deposited on the superconducting layer and another superconducting YBaCuO layer is laser deposited on the non-superconducting layer with the c-axes of all the layers being aligned. Contacts are applied to the two superconducting layers to form a junction device across the non-superconducting layer, which acts as a barrier layer.

11 Claims, 2 Drawing Sheets

LAYERED LATTICE-MATCHED SUPERCONDUCTING DEVICE AND METHOD OF MAKING

FIELD OF THE INVENTION

The invention relates generally to superconducting electronic devices. In particular, the invention relates to electronic devices in which at least some of the active layers are superconducting and some are not.

BACKGROUND ART

Beginning in 1986, there has been a resurgence in interest in superconductors. In that year, Bednorz and Muller discovered that the copper-based perovskite LaBaCuO showed a relatively high superconducting transition temperature $T_c$. Since then, interest has shifted to YBaCuO with $T_c$ around 92° K. The approximate chemical formula is $Y_1Ba_2Cu_3O_{7-x}$, with x being between 0 and 1, usually about 0.1 or 0.2 and indicating the oxygen stoichiometry upon which superconductivity critically depends. Closely related compounds ZBaCuO substitute Er, Gd, Eu or other elements for Y as the rare-earth component Z. These materials as presently grown have significant departures from stoichiometry because of imperfect crystallinity. Yet other classes of material offering yet higher transition temperatures of up to 125° K. are represented by the formula $A_2B_2Ca_{2n-1}Cu_nO_y$ where A is either Bi or Tl, B is either Ba or Sr, n=1, 2 or 3 and y is a value between 6 and 10. All of these high $T_c$ materials have been found to have a perovskite crystal structure. A perovskite crystal has a unit cell defined by lattice vectors a, b and c which are perpendicular to each other. In the high $T_c$ superconductors, a is equal or approximately equal in magnitude to b, but c is considerably larger. The location of the constituent atoms in a perovskite is described by A. F. Wells in his book entitled "Structural Inorganic Chemistry", 4th ed., Clarendon Press, 1975 at pages 149–154. In most of the high $T_c$ superconductors, the perovskite is in the orthorhombic form, that is, $a \neq b$, although they are relatively close. For most of these materials, as the oxygen deficiency is increased, the perovskite changes to the tetragonal form, that is, $a=b$, and the superconductivity disappears. However, there are some known tetragonal superconductors, such as $YBa_2Cu_{3-x}Co_xO_y$ for which $x > 0.1$.

It is of course anticipated that these high $T_c$ materials would be used in working electronic devices. However, to date, the results have been disappointing. Part of the reason has been the large and complex crystal structure involved in the high $T_c$ perovskite materials. While low $T_c$ Josephson junctions could be fabricated from superconducting niobium and its insulating oxide, the perovskites have not offered such simple material combinations. The high $T_c$ perovskites have a lattice constant of about 1.1 nm along the c-axis (the long perovskite axis) and of about 0.38 nm along the two axes in the a-b plane. However, superconducting coherence lengths $\epsilon$ for these high $T_c$ materials are of the order of 0.3 nm along the c-axis and of the order of 3 nm in the a-b plane. Therefore, the problem arises at the interface between different parts of the superconductive device which is not of the same superconductive quality as the bulk perovskite superconductor. For a multi-layer superconductive device, the interfaces must be sharp compared to the coherence lengths, that is, the transition of the $T_c$ of the film at the interface must occur over a distance which is less than the coherence length $\epsilon$. For the Bi and Tl superconductors, the c-axis lengths are even longer.

Some researchers have reported Josephson effects in high $T_c$ materials. For example, the technical article by Häuser et al entitled "Response of YBaCuO thin-film microbridges to microwave irradiation" appearing in Applied Physics Letters, volume 54, 1989, pp. 1368–1370. However, most of these reports are based on intergrain effects. That is, the high $T_c$ material was granular with each of the grains being superconductive. However, the interface between the grains somehow provided the required non-superconductive material.

A vertical YBCuO Josephson junction device has been disclosed by Moreland et al in a technical article entitled "Evidence for the superconducting proximity effect in junctions between the surfaces of $YBa_2Cu_3O_x$ thin films" appearing in Applied Physics Letters, volume 54, 1989, pp. 1477–1479. According to this article, two separate YBaCuO films are fabricated and then squeezed together at their exposed surfaces. That is, the device is not monolithic.

Koch et al have described a YBaCuO SQUID (superconducting quantum interference device) in a technical article entitled "Quantum interference devices made from superconducting oxide thin films" appearing in Applied Physics Letters, vol. 51, 1987, pp. 200–202. In this device, either oxygen or arsenic was ion implanted into already formed film of $YBa_2Cu_3O_y$ to form a 17 μm wide insulating strip between two superconducting YBaCuO regions. However, these devices showed low responsivity to magnetic fields. Further, the YBaCuO film had grain sizes of 2–5 μm.

Geerk, Xi and Linker of Karlsruhe have disclosed in some recent unpublished work the fabrication of vertical supercondutive tunneling devices. By the use of reactive magnetron sputtering, a film of $Y_1Ba_2Cu_3O_7$ was epitaxially grown on a $SrTiO_3$ substrate and thereafter was oxidized at 450° C. Sometime during the heat treatment or thereafter, a thin oxide formed on the YBaCuO. A counter electrode of Pb or In (superconductive at some of the operating temperatures) was applied by painting or attaching a wire. The asymmetry of the superconductive electrodes and the unknown insulator thickness made analysis of this device difficult.

In other recent and unpublished work, T. Shiota of Nagoya University has reported a symmetric YBaCuO tunnel junction. Both of the YBaCuO electrodes were deposited by RF magnetron sputtering. However, between depositions, the bottom electrode was plasmafluorinated to make a highly resistive thin barrier layer. The data reported to date by Shiota et al remain inconclusive as to the mechanism involved in the I-V characteristics of the YBaCuO-F:YBaCuOYBaCuO structure. Their results are difficult to interpret because of their admitted poor crystal quality.

SUMMARY OF THE INVENTION

Accordingly, an object of the invention is to provide a superconductive device and method of making it in which the electrical and superconductive properties of each of the layers can be well controlled.

Another object of the invention is to provide such a device and method whereby the interfaces between layers in a multilayer device will be abrupt.

The invention can be summarized as a method of fabricating a superconductive device composed of multiple layers of orthorhombic perovskites or closely lattice-matched materials. Each of the layers is epitaxially grown on the preceding layer. However, the electronic and superconductive properties are controlled by controlling the composition of the layer as it is being deposited.

DETAILED DESCRIPTION OF THE PREFERRED EMBODIMENTS

Recent methodical work has shown the dependence of electrical and superconductive properties of ZBa-CuO upon the choice of Z and the partial or complete substitution of other metal components for the Cu. This work has also shown that the orthorhombic perovskite structure is maintained for a wide range of these materials. In the embodiments described below, a Josephson junction is grown by epitaxially depositing a sequence of YBaCuO and PrBaCuO layers. These devices are used at cryogenic temperatures below liquid nitrogen temperature (78° K.) at which the YBaCuO is superconducting but the PrBaCuO is a dielectric. The advantage of this combination lies in the close lattice match in the a- and b-axes for YBaCuO and PrBaCuO, which allows for epitaxial-type growth between the layers. For YBaCuO, a=0.382 nm and b=0.389 nm, while for PrBaCuO, a=0.393 nm and b=0.386 nm.

Figure 1:
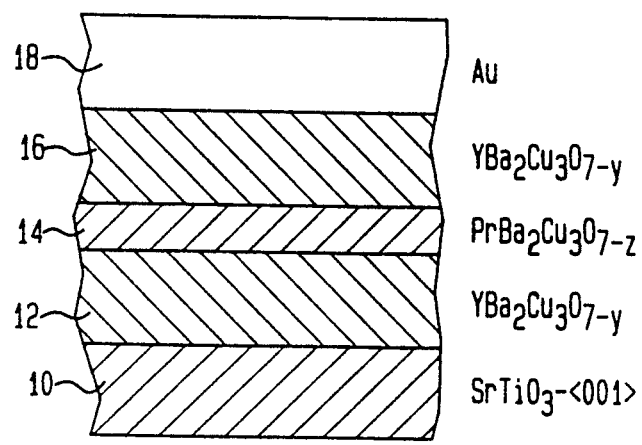
FIG. 1 is a cross-section of an epitaxial superconductor-insulator-superconductor multilayer structure according to the invention.

The structure of the grown device is shown in cross-section in FIG. 1 and consists of a substrate 10 of $SrTiO_3$, which has a perovskite structure and is oriented with its c-axis or <001> face vertical. Then, a first superconductor layer 12 of $YBa_2Cu_3O_{7-y}$, a dielectric layer 14 of $PrBa_2Cu_3O_{7-z}$, and a second superconductor layer 16 of $YBa_2Cu_3O_{7-y}$ are grown to be epitaxial to each other and to the $SrTiO_3$ substrate 10. A gold contact layer 18 is deposited to serve as electrical contact to the upper $YBa_2Cu_3O_{7-y}$ layer 16. Contact is made to the lower $YBa_2Cu_3O_{7-y}$ layer 12 in a subsequent fabrication step, to be described later. It is well known in the art to epitaxially grow a single layer of $YBa_2Cu_3O_{7-y}$ on the <001> face of $SrTiO_3$, which is a perovskite material. See the technical articles by Venkatesan et al entitled "Substrate Effects on the Properties of Y-Ba-Cu-O Superconducting Films Prepared by Laser Deposition" appearing in Journal of Applied Physics, volume 63, 1988, pp. 4591-4598 and by Miceli et al entitled "X-ray diffraction study of laser deposited high $T_c$ thin films on (001) $SrTiO_3$" appearing in AVS Proceedings on High $T_c$ Superconductors, Anaheim, Calif., Nov. 6, 1987. In the above materials, the designation $O_{7-y}$ or $O_{7-z}$ indicates that there is a deficiency of oxygen from the stoichiometric amount $O_7$. The amount of the deficiency is primarily determined by the growth and annealing conditions rather than the source material. As has been explained by Tarascon et al in a technical article entitled "Structural and physical properties of the metal (M) substituted $YBa_2Cu_{3-x}M_xO_{7-y}$ perovskite" appearing in Physical Review B, Vol. 37, 1988, pp. 7458-7469, $YBa_2Cu_3O_{7-y}$ is an orthorhombic superconductor for $y<0.2$. For lesser oxygen content, $y>0.2$, the material becomes a tetragonal semiconductor. However, it is also known that $PrBa_2Cu_3O_{7-z}$ is a dielectric, that is, not a superconductor.

The samples were grown by a variation of the low temperature laser deposition method described by Inam et al in a technical article entitled "As-deposited high $T_c$ and $J_c$ superconducting thin films made at low temperatures" appearing in Applied Physics Letters, volume 53, 1988, pp. 908-910 and by Dutta et al in a technical article entitled "Pulsed Laser Deposition: A Viable Process for Superconducting Thin Films?" appearing in Solid State Technology, February 1989, pp. 106-110.

As described by Inam et al, it is important for in situ growth of a superconducting layer to control the oxygen content of the film as it is being deposited. This is accomplished by surrounding the material plume emanating from the pellet with an box-like copper enclosure opened at opposing ends and measuring about 2 $cm^3$. A jet of oxygen gas is directly injected into the center of this box, as the particles pass in and out of the box, at a rate of 5 sccm while the chamber pressure 25 cm from the oxygen nozzle is maintained at 8 mTorr. Inam et al estimated the oxygen pressure in the plume based on these parameters as being of the order of 100 mTorr.

The low temperature method is a variant of the original high temperature method originally described by Dijkkamp et al in a technical article entitled "Preparation of Y-Ba-Cu oxide superconductor thin films using pulsed laser evaporation from high $T_c$ bulk material" appearing in Applied Physics Letters, volume 51, 1987, pp. 619-621 and by Venkatesan in a technical article entitled "Laser Deposited High $T_c$ Superconducting Thin Films" appearing in Solid State Technology, December 1987, pp. 39-41. This technique was later explained more fully by Wu et al in a technical article entitled "Versatility of pulsed laser deposition technique for preparation of high $T_c$ superconducting thin films" appearing in Proceedings of SPIE Symposium on High $T_c$ Superconductors, Newport Beach, Calif., March 1988, volume 948 and further disclosed by Venkatesan and Wu in U.S. patent application Ser. No. 07/331,795, filed Apr. 3, 1989. A good general discussion of both methods and the crystal structure of several high $T_c$ materials is made by Venkatesan et al in a technical article entitled "Advances in Processing High-Temperature Superconducting Thin Films with Lasers", appearing in Proceedings of Conference on Physical Chemistry of High Temperature Superconductors, American Chemical Society, 1988.

In general terms, in the pulsed laser deposition method a YBaCuO pellet was prepared by the method described by Tarascon et al in a technical article entitled "Oxygen and rare-earth doping of the 90-K superconducting perovskite $YBa_2Cu_3O_{7-x}$ appearing in Physical Review B, volume 36, 1987 at pages 226-234. Each pellet contains different powders contributing to the correct stoichiometry with the exception of an excess of oxygen. The PrBaCuO pellet was prepared by heating stoichiometric amounts of $Y_2O_3$, $Pr_6O_{11}$, $BaO_2$ and CuO and sintered in air at 820° C. for 10 hours. The compounds were pressed into pellets and annealed in oxygen for 10 hours at 900° C. This last preparation method was found effective for synthesizing $Y_{1-x}Pr_xBa_2Cu_3O_{7-y}$ over the range of x from 1% to 100%.

The so prepared pellets were placed in a deposition chamber containing the substrate. A short wavelength (248 nm) laser fired short (30 ns) intense (2J/$cm^2$ per pulse) laser pulses at the rates of a few pulses a second at the selected pellet. The stage holding the substrate was held at a temperature of 800° C. so that the substrate temperature was approximately 720° C. The evaporated material settled on the heated substrate held 4 cm from the pellet. Growth rates of 0.1 nm per laser pulse were typical. The deposition apparatus was modified for this invention to allow pellets of different composition to be placed on a carousel so as to be selectively positioned in the laser beam. This modification to the deposition apparatus has been described by Chase et al in a technical article entitled "Multilayer high $T_c$ thin film structures fabricated by pulsed laser deposition of Y-Ba.Cu-O", to appearing in Journal of Materials Research, volume 4, 1989 at pages 1326-1329 (a preprint of which was originally attached as an appendix to this application). A so selected pellet is rotated during irradiation without breaking the vacuum of the deposition chamber. During irradiation of one pellet target, the other targets were shielded.

For the growth of a large sample, the substrate 10 was held in a substrate holder within the deposition chamber and held at about 720° C. in an oxygen pressure of 220 mTorr. This oxygen atmosphere allows the in situ growth of a superconducting layer without a separate oxygen anneal for each layer. An oxygen pressure of 10 Torr and preferably 1 Torr represents an upper limit for an allowable oxygen pressure while 10 milliTorr represents a lower limit.

The carousel was first positioned with the YBaCuO pellet in the laser beam. About 1500 laser shots produced the first superconducting YBaCuO layer 12. Then the PrBaCuO pellet was brought into the laser beam and 80 laser shots produced the dielectric PrBaCuO layer 14. Subsequently, the YBaCuO pellet was repositioned in the beam and another 1000 laser shots produced the second superconducting YBaCuO layer 16. Based upon the nominal growth rate of 0.1 nm/shot, the YBaCuO layers 12 and 16 were both 150 nm thick and the PrBaCuO layer 14 was 10 nm thick. Vacuum was not broken during the deposition of all three layers of YBaCuO and PrBaCuO. Thereby, there was no opportunity for interfaces to become contaminated. Subsequent to the perovskite deposition, the temperature of the structure was slowly reduced to 100° C. at a rate of 20° C. per min. Then the oxygen was removed from the system and a gold (Au) target was selected. The gold was laser deposited to a thickness of 100 nm. The device was then soaked in 200 torr of $O_2$ at 450° for one-half hour, under which atmosphere the sample was allowed to cool.

By a Rutherford back scattering technique and by electron scattering, it was established that the entire YBaCuO and PrBaCuO structure grew in the perovskite structure and was lattice-matched, at least to the extent that the c-axes of all the three layers and the substrate were aligned. That is, all the deposited layers 12, 14 and 16 had an orthorhombic perovskite structure with the long c-axis aligned with that of the $SrTiO_3$ substrate 10. It is further believed that the films are single crystal and epitaxial between layers. X-ray rocking curves across the (005) line yield full widths at half maximum of $\Delta\theta \approx 0.42°$. We believe that the nearly perfect lattice matching between YBaCuO and PrBaCuO indicates an entire range of alloys $Y_{1-y}Pr_yBa_2Cu_3O_{7-x}$ ($0 \leq y \leq 1$) providing a heteroepitaxial system similar to GaAs/AlGaAs. Nonetheless, it is still possible that the epitaxial character extended only to the c-axis and that there were perhaps columnar grains.

It is noted that the Rutherford backscattering further indicated that the gold was crystallographically aligned with the underlying $YBa_2Cu_3O_{7-x}$.

The multilayer structure of FIG. 1 was processed into electrical devices using the photolithography, milling and contacting techniques described by Rogers et al in a technical article entitled "Fabrication of submicrometer features in Y-Ba-Cu-O superconducting thin films" appearing in IEEE Transactions on Magnetics, volume 25, 1989, pp. 1309-1312. In Roger's technique, the multilayer structure of FIG. 1 was photolithographically defined by an AZ-1518 photoresist mask to protect intended gold contact areas. The masked structure was then argon milled to remove the unprotected gold and produce upper current and voltage contacts 20 and 22, illustrated in FIG. 2. The Ar ion beam had a 1 kV acceleration potential and 50 $\mu A/cm^2$ beam current density at the sample.

After the upper contact isolation, the mask and ion beam steps were repeated to provide device isolation. The photoresist defined a mesa 24 and the ion milling removed unprotected portions of the upper YBaCuO layer 16 and the PrBaCuO layer 14.

Figure 2:
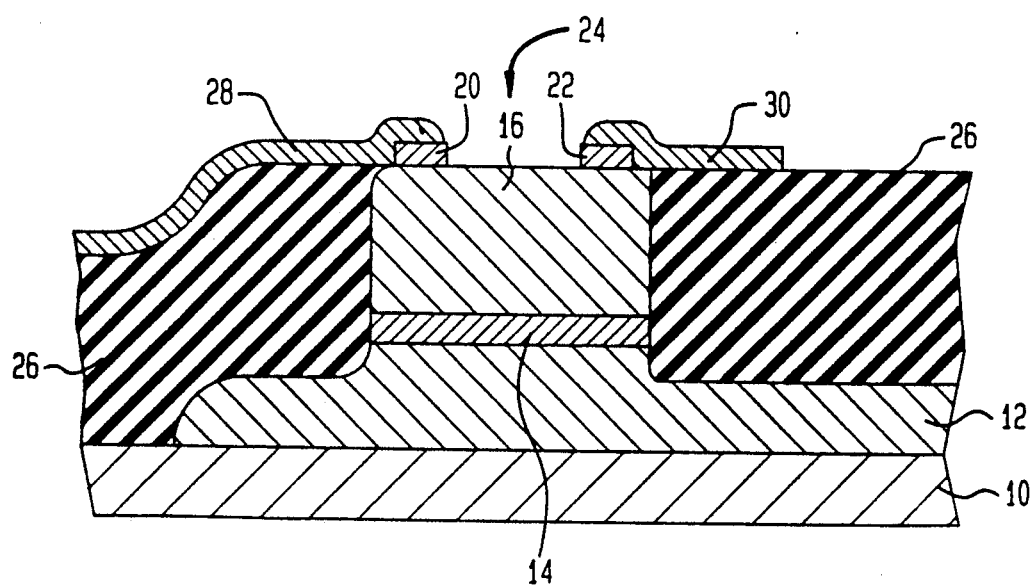
FIG. 2 is a cross-section of a device fabricated using the multilayer structure of FIG. 1.

In a third set of mask and ion beam steps, a large island including the mesa 24 was defined and the ion milling removed all of the unprotected portions of the YBaCuO and PrBaCuO layers 12, 14 and 16, as illustrated on the extreme right side of FIG. 2. The island included several mesas 24 having active areas of $2.5 \times 10^{-5} cm^2$ to $2 \times 10^{-7} cm^2$. Additionally a very large mesa having dimensions of $150 \times 80$ $\mu m$ was used for electrically contacting the bottom YBaCuO layer 12.

The third mask was then removed and the second mask was reapplied to cover the mesa 24. This reapplication of the second mask is considered suboptimal and could be avoided by a redesign of the masks. The device was then transferred, with the second mask in place, to a separate vacuum system. Approximately 80 nm of a mix of $SrF_2$ and $AlF_3$ (20:80 by weight) was thermally evaporated to form an insulating layer 26. Finally, Cr/Au leads 28 and 30 were lithographically defined and thermally deposited as a bottom layer of 10 nm of Cr and upper layer of 200 nm of Au. The leads 28 and 30 were continuous with large wire bonding pads located away from the device island. The finished chip was bonded to a chip carrier, the wire bonding pads were bonded with gold wires connected to pins on the chip carrier, and the chip carrier was plugged into a Janis variable temperature cryostat used during electrical measurements. The superconducting layers were cooled from the cryostat through the chip carrier and device substrate.

Since the area of the large mesa contacting the lower YBaCuO layer 12 was so much larger than those of the active mesas, its electrical resistance was negligible. Nonetheless, it would be preferable to provide a separate step to etch two via holes through the SrAlF layer 26 and deposit gold contacts directly to the lower YBaCuO layer 12.

Figure 3:
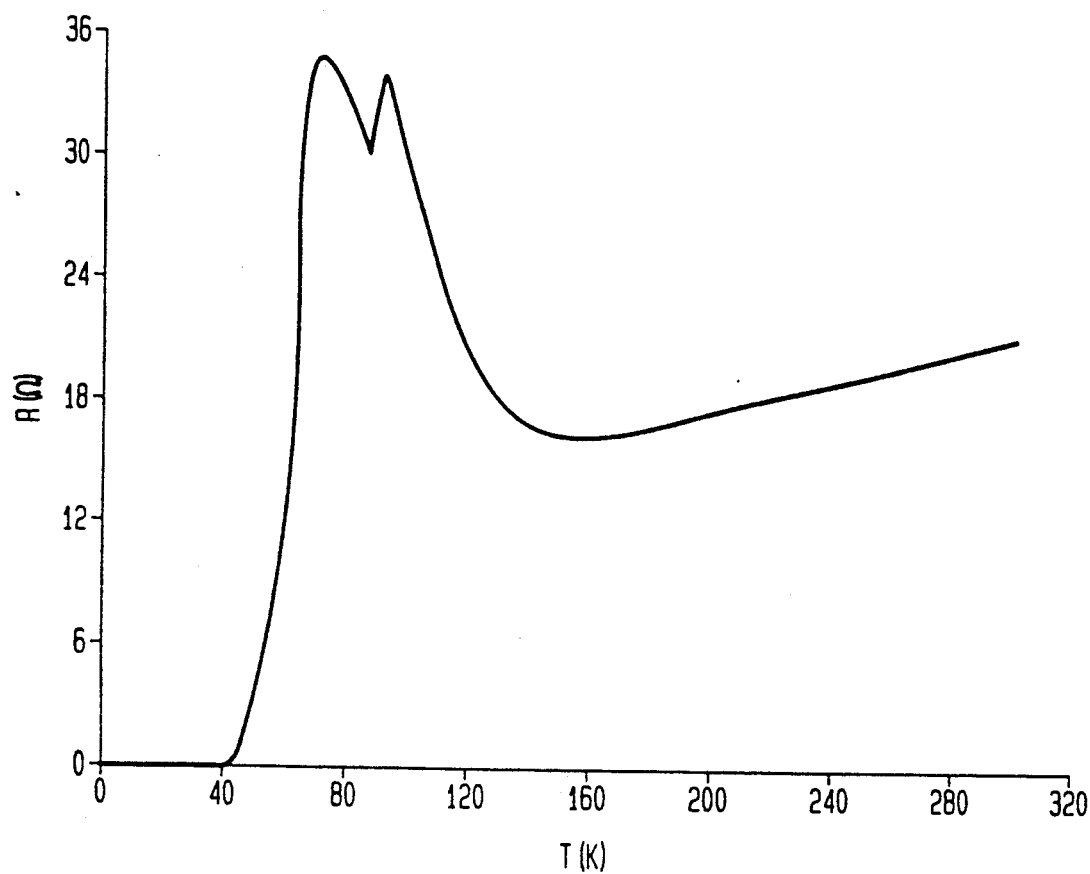
FIG. 3 is a resistance vs. temperature graph for the device of FIG. 2.

The resistance characteristics of the devices defined on the separate mesas 24 were measured as a function of temperature. A four-point measurement was performed. That is, on each of the mesas 24 under test and on the very large mesa, separate gold contacts 20 and 22 and leads 28 and 30 were used for measuring current and voltage. In FIG. 3 is shown the resistance curve for an active area of $5 \times 10^{-7} cm^2$ with a thickness of 50 nm for the PrBaCuO layer 14. Fully metallic conductivity appears above 160° K. A sharp drop in resistivity occurs near 85° K., possibly the superconducting transition temperature for YBaCuO. Below this temperature, the resistivity exhibits a second transition and finally falls to zero when the PrBaCuO finally becomes superconducting near 50° K., although this value varies from 40° K. to 65° K. for different devices.

Figure 4:
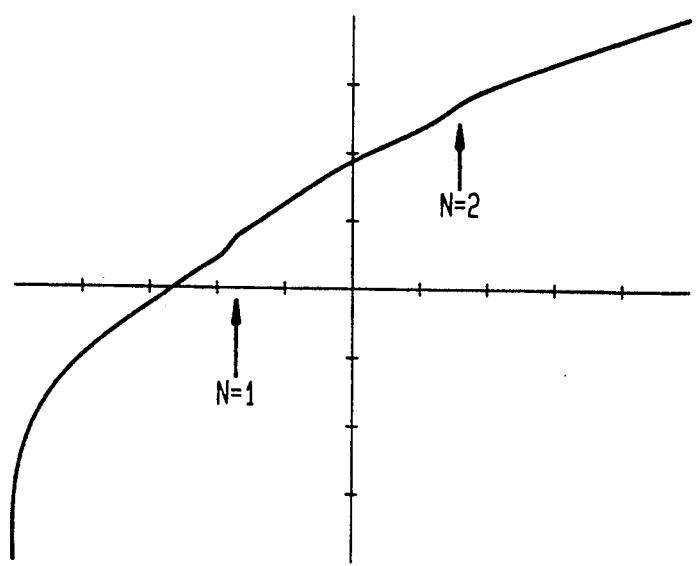
FIG. 4 is an I-V curve for the device of FIG. 2.

At, temperatures below the second transition, it is clear that there is supercurrent transport between the upper and lower YBaCuO layers 12 and 16. In FIG. 4 is shown a currentvoltage graph for the device of FIG. 3 at a temperature of 6° K. In this graph, current is plotted vertically at a scale of 50 $\mu$A/div and voltage is plotted horizontally at a scale of 50 $\mu$V/div. This I-V curve, typical for the devices fabricated, displays SNS-like behavior. That is, the YBaCuO layers 12 and 16 are superconducting while the PBaCuO layer 14 is a normal metal rather than an insulator. Nonetheless, it does indicate a good supercurrent $I_c$.

Our conclusions for devices of different areas are that the supercurrents increase proportionally to the device area and that the resistances scale linearly with the inverse of the device area. Specifically, for the devices of different areas but on the same chip as the results of FIGS. 3 and 4, $J_c = 300$ A/cm$^2$ to within 30%. Furthermore, the product of the resistance and critical current $I_c R_J$ of 3.5 mV is consistent with SNS transport. As the thickness of the PrBaCuO layer 14 was reduced to as little as 5 nm, the critical current density $J_c$ decreased with the PrBaCuO layer thickness and the $I_c R_J$ product did not vary appreciably.

The Josephson effect has been unambiguously observed while the DC I-V curve was measured while the device was subjected to incident microwave power at 84 GHz. Weak $N=1$ and $N=2$ constant voltage current steps arising from the AC Josephson effect were observed. These steps were never larger than 10% of $I_c$ at the power levels available from an IMPATT diode source.

The embodiments described above rely upon the c-axes of all layers being perpendicular to the surface. However, the principal direction of charge transport in perovskite superconductors lies in the a-b plane. Therefore, it would be advantageous to grow epitaxial layers with the c-axes lying parallel to the interface planes. An intermediate result is available if the substrate is cut a few degrees from its (001) plane and the previously described epitaxial growth method is followed. Then the growth is primarily along the c-axis but there is a limited amount of contact between the a-b planes of the different layers.

Layered superconductive devices having the above characteristics are usable for a variety of useful devices. An example use would be as a SQUID magnetometer. Such magnetic detectors are reviewed by Clarke in a technical article entitled "Advances in SQUID Magnetometers" appearing in IEEE Transactions on Electron Devices, volume ED-27, 1980, pp. 1896–1908.

Although the PrBaCuO barrier layer has been most extensively investigated, we have also fabricated similar devices using MgO or LaGaO$_3$ to a thickness of 10 nm as the barrier layer. Both of these materials have been shown to be good substrate material and to resist interdiffusion. MgO is not a perovskite but is closely lattice matched ($a = b = 0.42$ nm) to the a- and b-axes of YBaCuO and other perovskite superconductors. MgO barrier layers with YBaCuO superconducting layers have been fabricated on the following substrates and respective orientations: LaGaO$_3$ <001>, SrTiO$_3$ <001> and <110> and MgO <001>. The deposition of the MgO required a thickness calibration. This was accomplished by using the same laser deposition apparatus to deposit MgO on a gold film adhered to a MgO substrate. The MgO/Au structure was then probed with Rutherford back scattering. The strong gold signal calibrated the back scattering data and thus the deposition thickness. Other materials have also been used as the substrate, specifically, <110> SrTiO$_3$, <001> LaAlO$_3$ and <001> MgO. Initial non-electrical characterization has shown these to produce high quality physical structure and indicates heteroepitaxial growth.

Preliminary electrical measurements of fabricated devices with a 10 nm MgO barrier and YBaCuO superconducting layers formed on a (001) MgO substrate show superior superconducting properties for the YBaCuO electrodes. Resistance vs. temperature testing for multilayer transport show a sharp drop below 81° K. without the complex structure of FIG. 3. That is, both YBaCuO layers are fully superconducting below this temperature. Although Josephson behavior has not yet been observed in the MgO barrier devices, the ability to successfully grow a superconducting second layer indicates that the process can be optimized to produce an insulating barrier, and thus an SIS device, with MgO tunnel barriers.

The invention can be further extended to other material for use as the barrier layer, for example, the aluminates RAlO$_3$, the gallates RGaO$_3$, the ortho-ferrites RFeO$_3$ (where R is a rare earth element) and the 40° K. superconductors (La$_{1-x}$Sr$_x$)$_2$CuO$_4$. A specific example of this last material is the semiconductor La$_2$CuO$_4$.

In picking a particular material system, the crystal structures must be lattice matched so as to allow the oriented growth of the multiple layers. In the material systems which have been fabricated, the a- and b-axes of one layer are matched to within 5%. Thereby, heteroepitaxial growth becomes possible and the quality of the superconductive/non-superconductive interface is greatly improved. Such a restriction on the lattice lengths nonetheless allows a wide selection of materials with differing electronic properties.

What is claimed is:

1. A superconducting device, comprising:

a substrate having a crystal structure with a substrate crystalline direction aligned in a predetermined direction with respect to a surface of said substrate;

a first layer of a first composition and having a perovskite crystal structure with a first crystalline direction deposited vertically upon said surface of said substrate, said first crystalline direction of said first layer being aligned with said substrate crystalline direction;

a second layer of a second composition and having a crystal structure with said first crystalline direction deposited vertically upon said second layer, said first crystalline direction of said second layer being aligned with said first crystalline direction of said first layer;

a third layer of a third composition and having a perovskite crystal structure with said first crystalline direction deposited vertically upon on said second layer, said first crystalline direction of said third layer being aligned with said first crystalline direction of said first layer; and electrical contacts electrically connected to at least one of said first and third layers to form an electrical path passing through portions of said first and second compositions and therebetween across a horizontally extending interface between said first and second layers.

2. A superconducting device as recited in claim 1, further comprising:
cooling means for holding said first, second and third layers at an operating temperature at which at least one of said first, second and third layers is superconducting and another of said first, second and third layers is non-superconducting.

3. A superconducting-normal-superconducting device, comprising:
a substrate having a crystal structure with a substrate crystalline direction aligned in a predetermined direction with respect to a surface of said substrate;
a superconductive first layer of a first composition and having a perovskite crystal structure with a first crystalline direction deposited vertically upon said surface of said substrate, said first crystalline direction of said first layer being aligned with said substrate crystalline direction;
a normally conducting second layer of a second composition and having a crystal structure with said first crystalline direction deposited vertically upon said second layer, said first crystalline direction of said second layer being aligned with said first crystalline direction of said first layer;
a superconductive third layer of a third composition and having a perovskite crystal structure with said first crystalline direction deposited vertically upon said second layer, said first crystalline direction of said third layer being aligned with said first crystalline direction of said second layer; and
electrical contacts electrically connected to said first and third layers to form an electrical path passing through portions of said first and second compositions and therebetween across a first interface extending horizontally between said first and second layers and additionally through portions of said second and third compositions and therebetween across a second interface extending horizontally between said second and third layers.

4. A superconducting device as recited in claim 3, wherein said first and third compositions comprise ZBaCuO, where Z is chosen from a group consisting of Y and the rare-earth elements excluding Pr.

5. A superconducting device as recited in claim 4, wherein said second composition comprises PrBaCuO.

6. A superconducting device as recited in claim 4, wherein said first composition and said third composition comprise YBaCuO.

7. A superconducting device as recited in claim 6, wherein said second composition comprises MgO.

8. A superconducting device as recited in claim 3, wherein said second composition forms a perovskite crystal structure.

9. A superconducting structure, comprising:
a singly crystalline substrate;
a lower layer comprising PrBaCuO formed over and epitaxial with said substrate; and
a superconductive layer comprising ZBaCuO formed over and epitaxial with said lower layer, wherein Z is chosen from the group consisting of Y and the rare-earth elements excluding Pr.

10. A superconductive structure as recited in claim 9, wherein Z is Y.

11. A superconductive structure as recited in claim 10, wherein PrBaCuO substantially comprises $PrBa_2Cu_3O_{7-x}$ and ZBaCuO substantially comprises $YBa_2Cu_3O_{7-y}$, wherein both x and y lay in a range between 0 and 1.

* * * * *

UNITED STATES PATENT AND TRADEMARK OFFICE
CERTIFICATE OF CORRECTION

PATENT NO. : 5,087,605

DATED : February 11, 1992

INVENTOR(S) : Manjanath Subraya Hegde, Arun Inam, Charles Thorne Rogers, Jr., and Thirumalai Venkatesan It is certified that error appears in the above-identified patent and that said Letters Patent is hereby corrected as shown below:

Column 2, line 36, "supercondutive" should read --superconductive--.
Column 7, line 9, "At," should read --At--;
 line 12, "currentvoltage" should read --current-voltage--;
 line 36, "constant voltage" should read --constant-voltage--.

Signed and Sealed this

Twenty-seventh Day of April, 1993

Attest:

MICHAEL K. KIRK

Attesting Officer

Acting Commissioner of Patents and Trademarks